United States Patent [19]

Fountain et al.

[11] Patent Number: 4,896,227
[45] Date of Patent: Jan. 23, 1990

[54] METHOD OF LOCATING AND INSPECTING DROPOUTS ON A MAGNETIC DISC

[75] Inventors: Frank S. Fountain, Wilmington, Del.; Donald K. Pusey, West Grove, Pa.

[73] Assignee: E. I. DuPont De Nemours & Co., Wilmington, Del.

[21] Appl. No.: 333,836

[22] Filed: Apr. 5, 1989

Related U.S. Application Data

[63] Continuation-in-part of Ser. No. 84,011, Aug. 11, 1987, abandoned.

[51] Int. Cl.$^4$ .............................................. G11B 27/36
[52] U.S. Cl. ...................................... 360/31; 324/212
[58] Field of Search ........................................... 360/31

[56] References Cited

U.S. PATENT DOCUMENTS

| | | | |
|---|---|---|---|
| 3,525,930 | 8/1970 | Hodge | 324/34 |
| 3,534,166 | 10/1970 | Kospel | 178/6.6 |
| 3,662,158 | 5/1972 | Wong et al. | 235/92 PC |
| 3,781,835 | 12/1973 | Dion et al. | 340/174.1 B |
| 4,197,011 | 4/1980 | Hudson | 356/354 |
| 4,323,934 | 4/1982 | Giraud | 360/38.1 |
| 4,325,134 | 4/1982 | Longley | 369/53 |
| 4,409,627 | 10/1983 | Eto | 360/38.1 |
| 4,417,149 | 11/1983 | Takeuchi | 250/572 |
| 4,477,890 | 10/1984 | Mooney et al. | 369/53 |
| 4,638,374 | 1/1987 | Yoshitake et al. | 358/336 |
| 4,686,563 | 8/1987 | Fountain et al. | 360/38.1 |
| 4,729,041 | 3/1988 | Kuroda | 358/336 |
| 4,731,675 | 3/1988 | Tachibana et al. | 360/38.1 |
| 4,737,723 | 4/1988 | Mita | 360/38.1 |

FOREIGN PATENT DOCUMENTS

| | | |
|---|---|---|
| 0183481 | 6/1986 | European Pat. Off. . |
| 3246110 | 6/1983 | Fed. Rep. of Germany . |
| 1066472 | 4/1967 | United Kingdom . |

OTHER PUBLICATIONS

1266 Hewlett-Packard Journal, vol. 36, No. 11, Nov. 1985.
IEEE Transactions on Magnetics, vol. Mag-18, No. 6, pp. 1092-1094, New York, U.S.; T. D. Lee et al.: "Analysis of Dropouts in Video Tapes".
IEEE Transactions on Magnetics, vol. Mag-19, No. 5, pp. 1656, 1657, New York, U.S.; D. M. Perry et al.: "Measurement of Surface Topography of Magnetic Recording Materials".

Primary Examiner—Vincent P. Canney

[57] ABSTRACT

A method of determining the angular and radial location of defects causing dropouts on a magnetic disc, and using this information to position individual dropouts in the field of view of a microscope.

13 Claims, 1 Drawing Sheet

METHOD OF LOCATING AND INSPECTING DROPOUTS ON A MAGNETIC DISC

This application is a continuation-in-part of application Ser. No. 07/084,011 filed Aug. 11, 1987 now abandoned.

BACKGROUND OF THE INVENTION

This invention is a method of detecting, and pinpointing the location of, signal losses on a magnetic disc, and of inspecting those locations where such signal losses have occurred, for purposes of analysis.

DESCRIPTION OF THE RELATED ART

Information, such as digital data, may be recorded on a magnetic disc for replay at a later time. The quality of the disc, and of the playback, are occasionally affected by momentary losses of recorded signal which are usually referred to as "dropouts". It has been found that an evaluation of selected dropouts is useful in identifying the causes of the signal losses and that frequently the manufacturing process may be changed to improve the quality of the disc, based on this evaluation. Valuable information as to reasons for losses of signal may be obtained, for example, by inspecting individual dropouts with a microscope. This technique is, or tends to be, laborious and time-consuming and also may be inconclusive since only a fraction of counted dropouts on a given disc can be located for analysis, using existing techniques.

Various devices and methods are known to the art for detecting defects in sheet material, including magnetic tapes and discs. U.S. Pat. Nos. 3,525,930 to Hodge and 3,662,158 to Wong et al., for example, show signal dropout detection devices in which counters are employed to determine the number of dropouts. U.S. Pat. No. 3,781,835 to Dion et al. is another example of a dropout detection device, which more specifically teaches a method of certifying magnetic recording discs. In such method three heads are moved in a continuous spiral across the surface of the disc. One head detects noise in DC erased tracks on the disc, the second head records a continuous pattern of pulses on such disc, and the third head reads back the recorded pulses. Dropouts are detected by determining when a pulse has been reduced in amplitude by a certain percentage.

In other known defect detection devices, means or steps are also provided for determining the locations of individual defects and for making that information available to a user. U.S. Pat. No. 4,477,890 to Mooney et al., for example, discloses an apparatus for generating a map of detectable characteristics of a disc. The disc is scanned optically in a spiral pattern using a laser beam. The detector detects the reflection characteristics of the surface of the disc and provides a signal to a display device. The display device, a storage oscilloscope, is provided with drive inputs to cause the oscilloscope beam to follow a spiral pattern corresponding to the scan pattern.

U.S. Pat. No. 4,638,374 to Yoshitake et al. is another example of a defect detecting apparatus for a rotary recording medium or disc. Such patent teaches detecting the starting and end positions of a dropout using first and second dropout selecting circuits which produce first and second dropout detection signals. An angle detection signal is generated which is indicative of angular positions on the disc where the first and second detection signals are generated with respect to a reference position which is related to a reference signal. The disc is divided into 45° segments and when dropouts occur extensively in the same part or segment of a plurality of discs, it is possible to check the samples, the original disc, or the like so as to locate and eliminate the cause of the dropouts.

In the same connection, U.S. Pat. No. 4,197,011 to Hudson discloses a system for scanning a light beam on a rotating grooved disc, such as a video disc, detecting the presence of defects on the surface of the disc and recording a polar plot of the defect locations on rotating disc-shaped photosensitive paper. The plot on the photosensitive paper maps the radial and circumferential locations of the defects. A rotating polygon scanner is used to scan a first laser beam radially on the disc being inspected and to scan a second laser beam on the photosensitive paper. The second laser bean is modulated on and off in accordance with the output of defect sensing circuitry responsive to the light reflecting from the surface of the disc being inspected.

Further, U.S. Pat. No. 4,417,149 to Takeuchi et al. shows an apparatus for detecting gross defects or holes in a web of sheet material, using a raster scanning laser beam, and then positioning a microscope at the location of the defect, base on this information, to examine and measure the defect.

And, lastly, in a method closely related to the method of this invention, the X-Y positions of dropouts detected on a magnetic tape are calculated by a computer which uses this information to position a microscope above a given dropout. The dropouts are detected in conjunction with frame and line sync pulse information recorded on the tape. Such method is more fully described in copending U.S. patent application Ser. No. 759,846, filed July 29, 1985, which application is incorporated herein by reference.

The present invention provides an improved method, not taught by the art, of precisely locating and storing information on dropouts detected on a magnetic disc and the subsequent use of this information to move successive dropouts into operative relationship with an inspection instrument.

In such method, dropouts on a magnetic disc are detected and information as to successive dropouts is stored in a memory array. Based on that information, data as to the radial and angular locations of the dropouts are computed. The disc is then moved into operative relationship with a disc-inspecting instrument and stopped in place when a selected dropout is located for inspection. Further movement of the disc is controlled on the basis of the computed data, thereby locating successive dropouts for inspection.

This method is very effective in enabling a user to rapidly inspect various dropouts, in magnetic discs, and to gather information, based on that inspection, which may prove useful in improving the quality of discs manufactured in the future.

SUMMARY OF THE INVENTION

Briefly described this invention is a method of selectively inspecting a magnetic disc in those locations where signal dropouts have been detected comprising the steps of:
  detecting the angular and radial location of each dropout on such disc,
  storing information as to the locations of the dropouts in a computer, controlling the position of the disc with respect to such instrument on the basis of the dropout location information stored in the computer, so that successive dropouts may be inspected by the disc inspection instrument.

Specifically the disc has information, such as digital data, recorded thereon and the dropouts are detected using a modified disc certifier. Information as to the disc track number and angular location of each dropout is stored in the computer.

In a preferred method the recorded information is written onto the disc by the certifier which then reads back such information and detects dropouts therein.

In one embodiment, the level of signal loss in digital data required to define a dropout, in the certifier, may be set prior to dropout detection. In another embodiment the level of signal loss defining a dropout is changed prior to continuing the dropout detection operation and the dropouts are coded to identify the levels of signal loss.

In another embodiment the information stored in the computer may be used to generate a map which displays the location and severity of the dropouts on both sides of the disc.

More specifically, the disc to be inspected by the method of this invention, has a plurality of concentric circular tracks and an index mark or index hole (hereinafter called a "synchronizing signal") thereon and such dropouts are located radially by track number and their angular position is determined by measuring the time between passage of the synchronizing signal and the dropout.

The disc inspection instrument is a part of a disc inspection device which includes a polar coordinate mechanical positioning table onto which the disc is placed and the table is rotated and moved to position the dropout to be inspected below such instrument, based on the dropout location information stored in the computer.

When a given dropout is selected for inspection, the computer calculates the radial and angular location of the dropout and sends the necessary control signals to the positioning table to move the disc so that such defect is positioned below the dropout inspection instrument.

This invention offers improvements over the prior art.

BRIEF DESCRIPTION OF THE DRAWING

The drawing is a diagram showing the method of this invention of detecting and storing information as to dropouts on a magnetic disc and the use of this information to selectively position individual dropouts where they may be inspected by a microscope.

DESCRIPTION OF THE PREFERRED EMBODIMENTS

Figure 1:
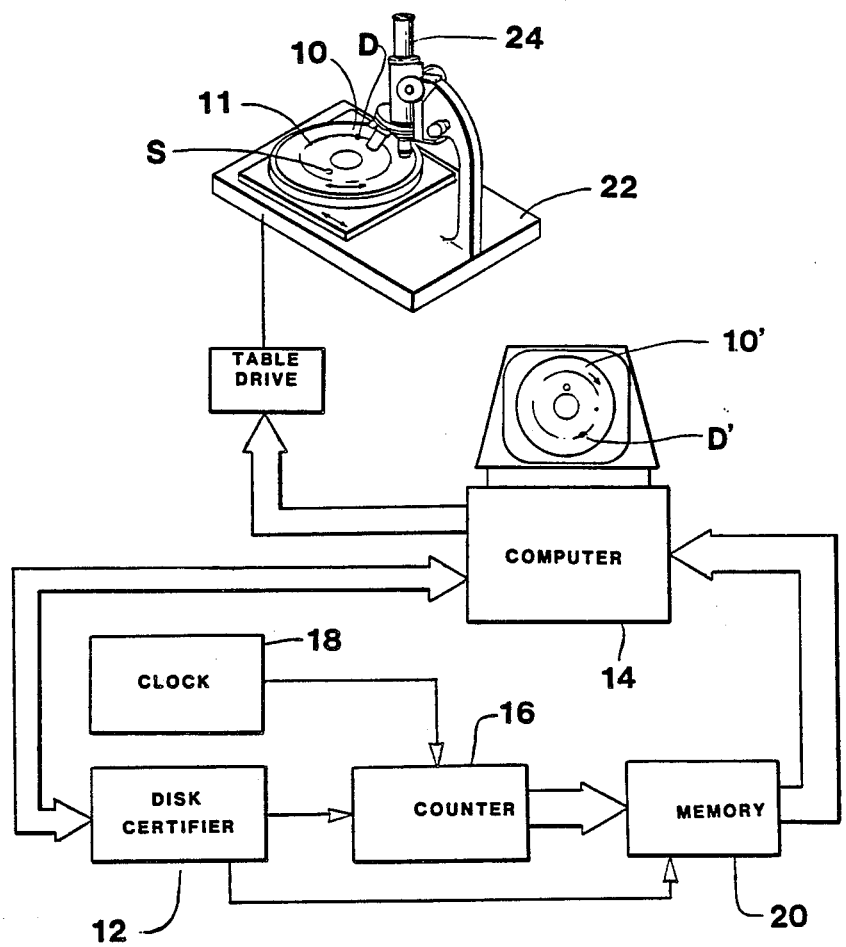

This invention is an integrated computer-controlled identification and location method for rapidly and positively identifying and locating defects in a magnetic disc causing dropouts and for selectively inspecting individual dropouts. The basis components used in such method include a modified professional certifier, a high quality modular microscope mounted above a precision driven, disc-micropositioning table, a modified commercial dropout counter, and a fully programmed desktop computer and printer.

The system is designed to operate in a fully integrated mode. Custom software allows computer control of the essential modules and components to positively locate and precisely position, for rapid microscopic examination, the specific areas on the disc where the dropouts are detected.

Using this method, identification of probable causes or sources of disc defects causing dropouts can be made in minutes rather than hours. Objective and concise answers to questions are provided rapidly and automatically. This capability has been proven to yield valuable information on the nature, source and causes of dropouts, whether in the coating, base film, processing, storage or use of the disc. It represents a break-through in positive dropout identification and location for disc manufacturers, suppliers and critical users.

Specifically, referring to the drawing, in the method of this invention the magnetic disc 10 to be tested is inserted into a disc certifier 12 which is controlled by a computer 14. The operator selects the level of signal loss to be defined as a dropout. This provides an improved diagnostic capability, such as examining only for severe loss of signal, if desired. The industry standard for dropouts is usually defined as 40 percent signal loss. The commercial certifier writes pulses on each track 11 of the disc and reads back the recorded information. When the signal level drops below the selected threshold the track number is displayed.

The certifier 12 scans each track sequentially. When a dropout D is detected the certifier interrupts the computer 14, identifies the type of dropout, the side of the disc and the track location. The certifier continuously scans this track. The computer 14 then arms the interface, which comprises a counter 16, a clock 18 and a memory 20, to obtain the angular position(s) of the dropout(s). A synchronizing pulse from the disc certifier 12 starts the counter 16 that is driven by the clock 18. The certifier has been modified so that the dropouts cause the certifier to send pulses to the interface. These pulses transfer the reading of the counter to the memory 20 in the interface and increment the memory. The disc has a synchronizing signal S in the form of an index hole or index mark formed in or printed at a known location on the disc. When the synchronizing signal S is next detected, its clock count value is deposited in the memory and the interface is disabled. The angular positions measured in degrees, of the dropouts are then determined by dividing the clock count value in a given memory location by the clock count value in the last memory location and then multiplying by 360. After this data is taken the computer 14 commands the certifier 12 to continue scanning the tracks 11.

After a complete scan of the disc, the signal level defining a dropout may be reduced and another scan begun. Each side of the disc can be completely tested, with the dropouts being catagorized by levels of signal loss, before the disc is removed from the certifier. A map 10' of the disc 10 is generated with the defects D color coded to identify the side of the disc and intensity coded to identify the level of signal loss when displayed on a CRT video display. In this context, the term "dropout", as used herein, only designates predetermined levels of magnetic signal loss and not a complete loss of signal, as would occur, for example, when a hold is present in the disc.

The disc may then be placed upon a polar coordinate mechanical positioning table 22 for examination of the defective areas under a microscope. The operator selects the side of the disc to be examined. The operator selects the defect to be examined by moving a cursor on the display screen to the color coded dot representing the defect of interest.

As an option, the cursor may be represented as a crosshair or as the outline of the read/write head. The outline of the read/write head is provided to assist the operator in determing the specific nature of the defect which caused the dropout. The computer 14 then calculates the radial and angular position of that defect and sends the necessary control signals to the positioning table 22. The table is moved and rotated to position the defect of interest in the field of view of an optical microscope 24 or other disc inspection instrument. After the defect has been positioned the cursor may be moved, which causes the positioning table to move, thus allowing the operator to examine areas on the disc adjacent to the indicated dropout.

In an operable embodiment of this invention, the disc certifier is a 3PX Floppy Disc Certifier made by Three Phoenix Co., the computer is a Model 9836C and the interface is a Model 6942A Multiprogrammer and its associated modules, made by Hewlett-Packard, Inc. Modules for the multiprogrammer, all made by Hewlett-Packard, Inc., include a clock (Model 69736A), a counter (Model 69775A) and a memory (Model 69790B). The positioning table is comprised of an ATS 303 MM/45/SMH/MH rotary positioning module and an ATS 302M/45/SMW/MH linear positioning module and a Unidex II/2C/W/W/1401/1401/SM-0/SM-0 table drive, made by Aerotech, Inc., Pittsburgh, Pa.

What is claimed is:

1. A method of selectively inspecting a magnetic disc in those locations where dropouts in the form of loss of magnetic signal intensity of information recorded thereon have been detected comprising the steps of:
   detecting dropouts on the disc by:
   rotating the disc at a substantially constant angular velocity while recording a magnetic signal of constant intensity along predefined concentric circular tracks
   rotating the disc at the same substantially constant angular velocity while reading the recorded magnetic signal along said predefined tracks
   comparing the intensity of the read signal with a predefined threshold to detect a level of loss of magnetic signal intensity
   rotating the disc at the same substantially constant angular velocity while reading the recorded magnetic signal along said predefined tracks
   comparing the intensity of the read signal with a different predefined threshold to detect another level of loss of magnetic signal intensity
   determining the angular position of detected losses of signal intensity by:
   measuring a first time interval between passage of a synchronizing signal on the disc and each detected loss of magnetic signal intensity
   measuring a second time interval between passage of said synchronizing signal and subsequent second passage of said synchronizing signal and
   dividing the first time interval by the second time interval and multiplyinq the resulting quotient by 360 to precisely define the angular position of each dropout in degrees
   storing information as to such detected losses of magnetic signal intensity in a computer,
   generating a map of the disc with the levels of losses of magnetic signal intensity color coded
   displaying said map on a color CRT display device and
   moving the disc into operative relationship with a disc inspecting instrument, and controlling the position of the disc with respect to such instrument on the basis of said detected signal loss location information stored in the computer,
   so that specific dropouts may be selected for inspection by positioning a cursor over the color coded symbol representing the detected magnetic signal losses and subsequently inspected by the disc inspection instrument.

2. The method of claim 1 wherein the information is written onto the disc by a certifier which then reads back such information and detects dropouts therein.

3. The method of claim 1 wherein the disc has a plurality of tracks and a synchronizing signal thereon and wherein such dropouts are located radially by track number and their angular position is determined by measuring the time between passage of the synchronizing signal and the dropout.

4. The method of claim 3 wherein the synchronizing signal is an index hole formed at a known location in the disc.

5. The method of claim 3 wherein the synchronizing signal is an index mark recorded at a known location on the disc.

6. The method of claim 1 wherein the disc inspection instrument is a part of a disc inspection device which includes a polar coordinate mechanical positioning table onto which the disc is placed and wherein the table is rotated and moved to position the dropout to be inspected below such instrument, based on the dropout location information stored in the computer.

7. The method of claim 1 wherein the information recorded on the disc is in the form of digital data.

8. The method of claim 1 wherein the information recorded on the disc is in analog form.

9. The method of claim 1 wherein when a given dropout is selected for inspection, the computer calculates the radial and angular location of the dropout and sends the necessary control signals to the positioning table whereby to move the disc so that defect is positioned below the dropout inspection instrument.

10. The method of claim 2 and further including the step of setting the level of signal loss required to define a dropout, in the certifier, prior to dropout detection.

11. The method of claim 10 wherein the level of signal loss defining a dropout is changed prior to continuing the dropout detection operation and wherein the dropouts are coded to identify the levels of signal loss.

12. The method of claim 1 wherein a map is generated, using the information stored in the computer, which displays the location and severity of the dropouts on both sides of the disc.

13. The method of claim 2 wherein a map is generated, using the information stored in the computed which simultaneously displays the location and severity of the dropouts on both sides of the disc.

* * * * *